(12) United States Patent
Miccoli et al.

(10) Patent No.: US 10,504,587 B2
(45) Date of Patent: Dec. 10, 2019

(54) METHOD AND SYSTEM FOR COMPENSATING FOR FLOATING GATE-TO-FLOATING GATE (FG-FG) INTERFERENCE IN FLASH MEMORY CELL READ OPERATIONS

(71) Applicant: Intel Corporation, Santa Clara, CA (US)

(72) Inventors: Carmine Miccoli, Santa Clara, CA (US); Akira Goda, Boise, ID (US)

(73) Assignee: INTEL CORPORATION, Santa Clara, CA (US)

( * ) Notice: Subject to any disclaimer, the term of this patent is extended or adjusted under 35 U.S.C. 154(b) by 42 days.

(21) Appl. No.: 15/848,948

(22) Filed: Dec. 20, 2017

(65) Prior Publication Data

US 2019/0043565 A1   Feb. 7, 2019

(51) Int. Cl.
*G11C 16/04*   (2006.01)
*G11C 11/56*   (2006.01)
*G11C 16/34*   (2006.01)
*G11C 29/50*   (2006.01)
*G11C 29/02*   (2006.01)
*G11C 29/52*   (2006.01)
*G11C 16/26*   (2006.01)
*G11C 29/04*   (2006.01)

(52) U.S. Cl.
CPC ...... *G11C 11/5642* (2013.01); *G11C 16/0408* (2013.01); *G11C 16/0483* (2013.01); *G11C 16/3422* (2013.01); *G11C 16/3427* (2013.01); *G11C 29/021* (2013.01); *G11C 29/028* (2013.01); *G11C 29/50004* (2013.01); *G11C 29/52* (2013.01); *G11C 11/5628* (2013.01); *G11C 11/5635* (2013.01); *G11C 16/26* (2013.01); *G11C 2029/0409* (2013.01); *G11C 2029/0411* (2013.01)

(58) Field of Classification Search
CPC .. G11C 16/26; G11C 16/3418; G11C 16/3459
USPC .................................................. 365/185.03
See application file for complete search history.

(56) References Cited

U.S. PATENT DOCUMENTS 7,684,237 B2    3/2010  Moschiano et al.
2008/0285341 A1*  11/2008  Moschiano ........ G11C 16/3418
                                                    365/185.02

(Continued)

*Primary Examiner* — Hoai V Ho
*Assistant Examiner* — Minh Dinh
(74) *Attorney, Agent, or Firm* — Grossman, Tucker, Perreault & Pfleger, PLLC

(57) ABSTRACT

Embodiments of the present disclosure provide methods, devices, modules, and systems for compensating for floating gate to floating gate (fg-fg) interference in flash memory cell read operations. Compensating for fg-fg interference effects can reduce or prevent read errors. Embodiments of the present disclosure can compensate for fg-fg interference by determining the programmed state of aggressor (or influencing) memory cells that are programmed after a target memory cell. If the aggressor memory cell is in the erased state of Level 0 or is in a programmed state of Level 2-15, the target memory cell is identified as undisturbed. If the aggressor memory cell is programmed to a Level 1 (instead of Level 0 or Levels 2-15), the target memory cell is identified as disturbed. If the target memory cell is disturbed, sensing parameters may be adjusted to compensate for the disruption.

19 Claims, 5 Drawing Sheets

(56) References Cited

U.S. PATENT DOCUMENTS

| | | | |
|---|---|---|---|
| 2011/0038207 A1* | 2/2011 | Eun | G11C 11/5628 365/185.03 |
| 2012/0230104 A1* | 9/2012 | Kim | G11C 11/5642 365/185.03 |
| 2013/0238958 A1* | 9/2013 | Radke | G06F 11/1048 714/773 |

* cited by examiner

METHOD AND SYSTEM FOR COMPENSATING FOR FLOATING GATE-TO-FLOATING GATE (FG-FG) INTERFERENCE IN FLASH MEMORY CELL READ OPERATIONS

TECHNICAL FIELD

The present disclosure relates generally to semiconductor devices and, more particularly, to non-volatile memory devices having multi-level memory cells.

BACKGROUND

Memory devices are typically provided as internal, semiconductor, integrated circuits in computers or other electronic devices.

Flash memory devices are utilized as non-volatile memory for a wide range of electronic applications. Flash memory devices typically use a one-transistor memory cell that allows for high memory densities, high reliability, and low power consumption.

Two common types of flash memory array architectures are the "NAND" and "NOR" architectures, so called for the logical form in which the basic memory cell configuration of each is arranged. A NAND array architecture arranges its array of floating gate memory cells in a matrix such that the gates of each floating gate memory cell of the array are coupled by rows to word select lines. However, each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell ("SLC") can represent two binary states, e.g., 1 or 0. Flash memory cells can also store more than two binary states. Such cells may be referred to as multi state memory cells, multibit cells, or multilevel cells ("MLCs"). MLCs can allow the manufacture of higher density memories without increasing the number of memory cells since each cell can represent more than one bit. MLCs can have more than one programmed state, e.g., a cell capable of representing four bits can have 16 states, which are 15 programmed states and an erased state.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Although the following Detailed Description will proceed with reference being made to illustrative embodiments, many alternatives, modifications and variations thereof will be apparent to those skilled in the art.

DETAILED DESCRIPTION

As NAND flash memory is scaled, parasitic capacitance coupling between adjacent memory cell floating gates becomes a problem. Floating gate-to-floating gate ("fg-fg") interference can cause a wider threshold voltage ("Vth") distribution when the distribution should be narrower. The wider distributions can result in a degraded programming performance as well as other problems.

These problems for an SLC NAND array are even greater in an MLC NAND array. MLC memory stores multiple bits per cell by using different threshold voltage levels for each state that is stored. The difference between adjacent threshold voltage distributions may be very small as compared to an SLC memory device. Therefore, the effects of floating gate-to-floating gate coupling in an MLC device are greatly increased.

Embodiments of the present disclosure provide methods, devices, modules, and systems for performing improved corrective read operations of non-volatile multilevel memory cells. Various disclosed embodiments may enable improved corrective read operations by compensating for threshold voltage ("Vth") shifts of memory cells caused by floating gate to floating gate ("fg-fg") interference effects. Compensating for such fg-fg interference effects can reduce or prevent read errors (e.g., better than existing corrective read algorithms). Embodiments of the present disclosure may compensate for fg-fg interference by determining the programmed state of aggressor cells that are programmed after a target memory cell. If the aggressor memory cell is in the erased state or any state other than a first programming state, the target memory cell is identified as undisturbed. If the aggressor memory cell is programmed to a first (i.e., Level 1) programming level from the erased state (i.e., Level 0), the target memory cell is identified as disturbed. This relatively binary technique of identifying a target memory cell as disturbed or undisturbed is significantly faster than existing techniques that repeatedly read an aggressor memory cell to determine the precise programming state (e.g., of 8 or more states) of the memory cell. In a 4-bit memory cell, reading an aggressor memory cell can consume anywhere from 7-14 reads. Not only do such techniques consume more time (and slow down memory read times) than the presently disclosed embodiments, those techniques reduce memory cell lifespan, and those techniques less accurately identify fg-fg interference. Consequently, the disclosed corrective read techniques are an improvement over existing corrective read techniques.

Figure 1:
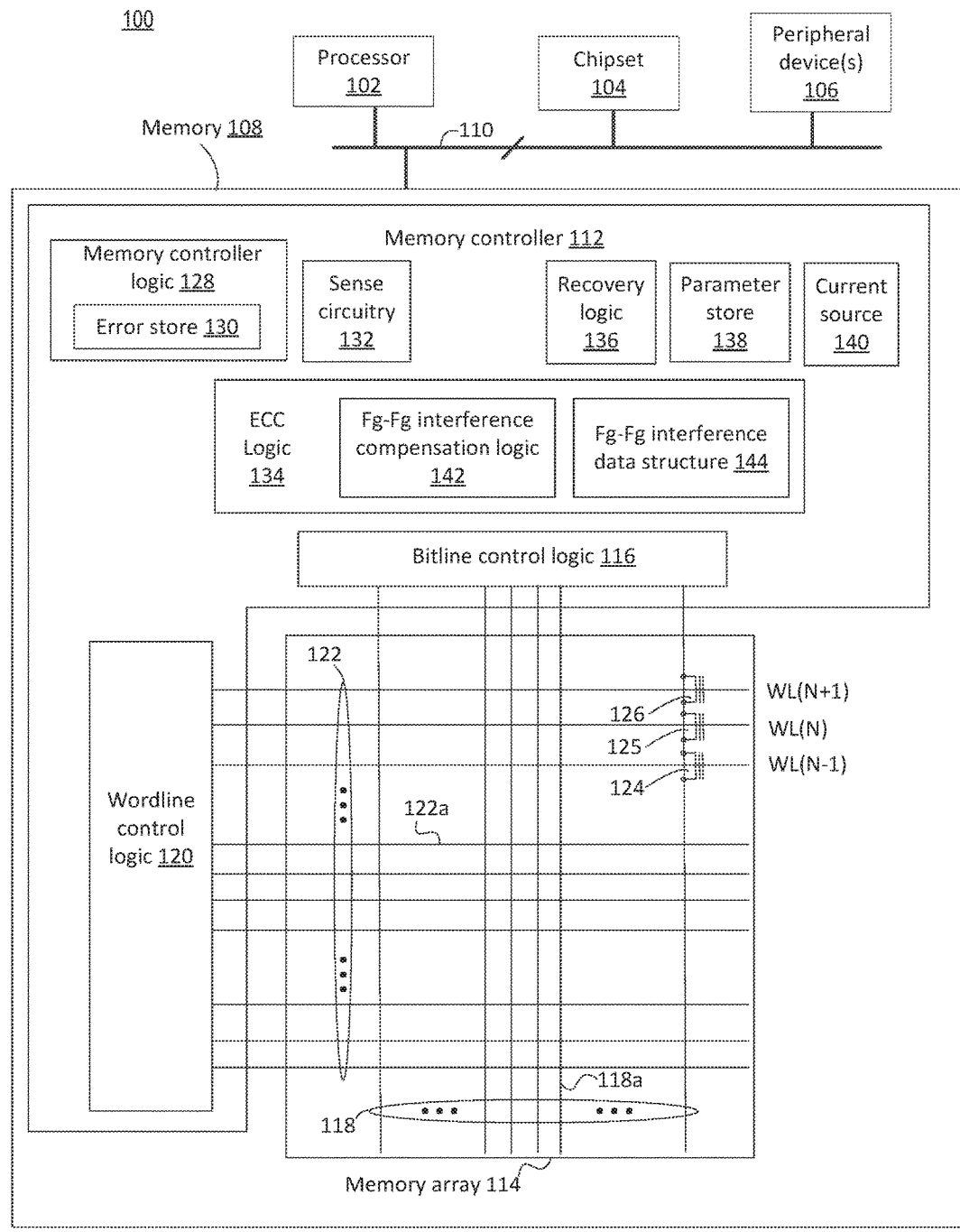
FIG. 1 is an example of a schematic depicting an illustrative system that compensates for fg-fg interference in flash memory cell read operations, in accordance with at least one embodiment described herein.

FIG. 1 illustrates a block diagram of a system 100 that is configured to compensate for fg-fg interference in flash memory cell read operations, consistent with several embodiments of the present disclosure. The system 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone.

The system 100 may include a processor 102 that is communicatively coupled to a chipset 104, peripheral device(s) 106, and a memory 108, according to one embodiment. The processor 102, the chipset 104, the peripheral device(s) 106, and the memory 108 are communicatively and/or physically coupled to each other through one or more buses 110, according to one embodiment. The processor 102 may correspond to a single core or a multi-core general purpose processor, such as those provided by Intel® Corporation, etc., according to one embodiment. The chipset 104 may include, for example, a set of electronic components that includes the one or more buses 110 to facilitate communication between components of the system, and that manages data flow between the processor 102, the memory 108, and the peripheral device(s) 106, according to one embodiment. The peripheral device(s) 106 may include, for example, user interface device(s) including a display, a touch-screen display, a printer, a keypad, a keyboard, wired and/or wireless communication logic, and storage device(s) (including hard-disk drives, solid-state drives, and removable storage media), etc., according to one embodiment. It should be noted that system 100 is simplified for ease of illustration and description.

The memory 108 is coupled to the processor 102 and is configured to receive instructions, receive addresses, receive data, and provide data to the processor 102 and to the bus 110, in response to one or more instructions received from the processor 102, according to one embodiment. The memory 108 may be a single non-volatile memory die, according to one embodiment. The memory 108 may be a storage device (e.g., a solid-state drive) that includes one or more memory controllers and one or more memory arrays or flash memory dice, according to one embodiment. The memory 108 may be a non-volatile memory, e.g., a storage medium that does not require power to maintain the state of data stored by the storage medium, according to one embodiment. Non-volatile memory may include, but is not limited to, a NAND flash memory (e.g., Single-Level Cell ("SLC"), Multi-Level Cell ("MLC"), a Triple-Level Cell ("TLC"), a Quad-Level Cell ("QLC"), or some other NAND), NOR memory, solid-state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random byte accessible 3D XPoint™ memory (or other 3D crosspoint memory architectures), Optane® memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D XPoint™ memory (or other 3D crosspoint memory architectures) may include a transistor-less stackable crosspoint architecture in which memory cells sit at the intersection of wordlines and bitlines and are individually addressable and in which bit storage is based on a change in bulk or channel resistance, in accordance with various embodiments.

The memory 108 includes a memory controller 112 that is configured to address, write to, and read from, a memory array 114, according to one embodiment. The memory controller 112 is configured to perform memory access operations, e.g., reading a target memory cell and/or writing to a target memory cell, error-correcting code ("ECC") check operations, and memory cell recovery operations, according to one embodiment. The memory controller 112 may be partially or fully implemented in the memory die or dice for the memory array 114 or may be partially or fully implemented external to the memory die or dice for the memory array 114, according to various embodiments. The memory array 114 includes a plurality of memory cells that are organized by one or more strings (e.g., columns), pages (e.g., wordlines or rows), blocks, tiles, and planes of memory cells, according to one embodiment.

The memory controller 112 uses bitline control logic and wordline control logic to address and access the memory array 114, according to one embodiment. The memory controller 112 includes bitline control logic 116 that controls a plurality of bitlines 118 (individually, for example, bitline 118a), according to one embodiment. As described and illustrated in the memory array 114, the illustrated bitlines 118 may represent both bitlines and memory cell strings that are coupled to the bitlines, even though the two structures are actually quite different. That is, memory cell strings represent multiple semiconductor channels of memory cell transistors coupled together in series, while a bitline is a conductor that is used to transfer data from a memory cell to other logic within the memory 108. The bitline control logic 116 includes controller logic (e.g., to switch between inhibit, program, erase, and read, voltage levels for the plurality of bitlines 118), according to one embodiment.

The memory controller 112 includes wordline control logic 120 that applies voltage levels to a plurality of wordlines 122 (individually, for example, wordline 122a), according to one embodiment. The wordline control logic 120 includes one or more voltage regulators that generate one or more voltage levels to access, read, program, and/or erase memory cells (e.g., memory cells 124, 125, 126) of the memory array 114, according to one embodiment.

The wordline control logic 120 is configured to receive target wordline address(es) from the memory controller 112 and to select or access wordlines for reading (or writing operations), according to one embodiment. For example, the wordline control logic 120 may be configured to select a target wordline by coupling a wordline select bias voltage from a voltage regulator to the target wordline. The wordline control logic 120 may be configured to deselect a target wordline by decoupling the target wordline from the wordline select bias voltage and/or by coupling a wordline deselect bias voltage to the wordline, according to one embodiment. The wordline control logic 120 includes global wordline drivers, according to one embodiment. The wordline control logic 120 includes select gate source ("SGS") and select gate drain ("SGD") drivers, according to one embodiment. The voltage regulator is a wordline regulator, according to one embodiment. The wordline control logic 120 is at least partially fabricated under the memory array 114, for example, using CMOS under array ("CUA") fabrication techniques, according to one embodiment.

The memory controller 112 may include additional logic to facilitate memory array operations and communication with one or more of the processor 102, the chipset 104, and the peripheral device(s) 106, according to one embodiment. The memory controller 112 may include one or more of memory controller logic 128, error store 130, sense circuitry 132, ECC logic 134, recovery logic 136, parameter store 138, and a current source 140, according to one embodiment. The memory controller logic 128 may be configured to perform operations associated with memory controller 112. For example, the memory controller logic 128 may manage communications with the processor 102 and may be configured to identify one or more target wordlines associated with each received memory address (e.g., in a read request). The error store 130 includes the fail type for memory read or access fails, according to one embodiment. The sense circuitry 132 may be configured to detect a quantity of current passing through a memory cell, e.g., during a read operation, according to one embodiment. The ECC logic 134 is configured to provide error checking functionality for memory controller 112, according to one embodiment. The recovery logic 136 is configured to manage recovery of failed reads/writes for associated memory cells identified by ECC logic 134 and/or memory controller logic 128, according to one embodiment. The parameter store 138 is configured to store the number of adjacent memory cells to select, and to store parameters associated with a sequence of recovery pulses. The number of adjacent memory cells to select may be based, at least in part, on the type of fail (e.g., read/write), memory array density, and/or maximum current available from the current source 140, according to one embodiment. The current source 140 supplies current to one or more portions of the memory 108, according to one embodiment.

The ECC logic 134 includes fg-fg interference compensation logic 142 that determines whether a memory cell to be read (e.g., a target memory cell) has been disturbed. If a target memory cell has been disturbed by fg-fg interference, the memory cell is referred to as a victim memory cell. The memory cell that causes the fg-fg interference is referred to as an aggressor memory cell. The fg-fg interference compensation logic 142 determines that a target memory cell has been disturbed if an adjacent memory cell (on the same memory string) has been programmed to a first programming state (e.g., Level 1 of Levels 0-15) that is between an erased state (e.g., Level 0) and at least 14 other programming states (e.g., Levels 2-15). The first programming state (e.g., Level 1) is adjacent to the erased state. The capacitive coupling between an aggressor memory cell and a target memory cell disturbs the target memory cell such that the threshold voltage ("Vth") of the target memory cell will be increased from what the Vth was programmed to. This effect is particularly influential on target memory cells that are being programmed in QLC (i.e., 4 bits). Notably, although minor shifts in Vth for a target memory cell occur after an aggressor memory cell is programmed to any one of the programming states of Levels 2-15, determining the exact programming state from these types of aggressor memory cells provides negligible benefit and consumes significantly more time, in order to read the state of the aggressor memory cell. In one embodiment, the fg-fg interference compensation logic 142 determines if the aggressor memory cell is in the erased state or not. If the aggressor memory cell is in the erased state, the target cell is identified as undisturbed. If the aggressor memory cell is in the programming state Level 1, the target memory cell is identified as disturbed, according to one embodiment. In a QLC NAND embodiment, if the aggressor memory cell is in the programming state Level 0, or 2-15, the target memory cell is identified as undisturbed, according to one embodiment. This relatively binary determination is faster than determining the exact state of the aggressor memory cell and provides better compensation results than techniques that involve determining the exact programmed state (e.g., Levels 0-15 (QLC)) of the aggressor memory cell, according to one embodiment. In some implementations, the disclosed techniques have increased the voltage read window bands (e.g., margins) between distributions of QLC memory cells by 0.21 V, which decreases the likelihood of reading errors.

Turning to FIG. 1 to illustrate, memory cell 124 is operated by wordline WL(N−1), memory cell 125 is operated by wordline WL(N), and memory cell 126 is operated by WL(N+1). When memory cells 124, 125, and 126 are programmed, the wordline control logic 120 applies programming voltage levels in a sequence of WL(N−1), WL(N), and WL(N+1), according to one embodiment. The sequence of wordlines of WL(N−1), WL(N), and WL(N+1) may be from a bottom of the memory array to a top of the memory array, or may be from a top of the memory array to the bottom of the memory array. In either case, if the memory cell 126 on the wordline WL(N+1) is programmed from an erased state (i.e., Level 0) to first programming state (i.e., Level 1), the memory cell 125, which is adjacent (i.e., on the same memory cell string) to the memory cell 126, will have already received a programming state and will be disturbed by the programming of the memory cell 126 with the wordline WL(N+1). As a result, the fg-fg interference compensation logic 142 may identify the memory cell 125, the target memory cell, as disturbed and may cause the wordline control logic 120 or the memory controller logic 128 to apply an adjusted sense parameter (e.g., a higher wordline read voltage level, a higher sense voltage level, a lower bitline voltage, and/or a longer strobe time) to a read operation for, as an illustrative example, the memory cell 125, according to one embodiment.

The ECC logic 134 may include an fg-fg interference data structure 144 that is used by the fg-fg interference compensation logic 142 to store data that is representative of whether a target memory cell is disturbed or undisturbed. The fg-fg interference data structure 144 includes a number of latches (e.g., single bit latches) that store a "1" if a target memory cell is disturbed and that store a "0" if the target memory cell is undisturbed, according to one embodiment. Other data structures may also be used.

Figure 2:
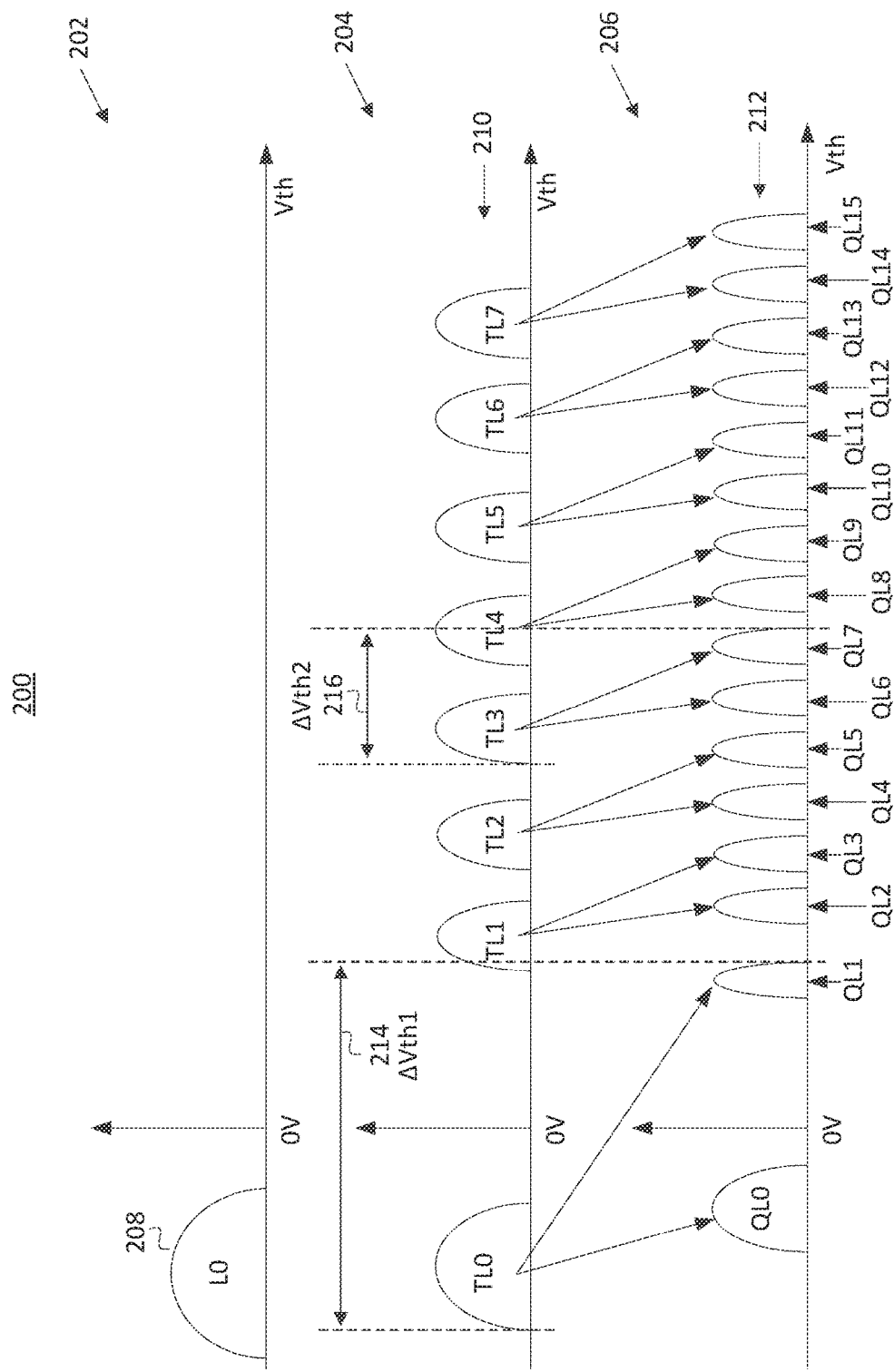
FIG. 2 is an example of a simplified diagram that illustrates multi-pass programming of a flash memory cell array, in accordance with at least one embodiment described herein.

FIG. 2 illustrates a diagram 200 of a simplified flow of two programming passes that redistribute flash memory cells from an erased threshold voltage distribution to a TLC 8 programming state threshold voltage distribution, to a QLC 16 programming state threshold voltage distribution. Multiple programming passes are currently used to program multi-level non-volatile memory to reduce fg-fg interference because, for example, programming a memory cell from an erased state directly to another programming state (e.g., Level 15) can negatively influence or shift the programming state of adjacent memory cells. The diagram 200 illustrates that the change in threshold voltage ("Vth") distribution from an erased state of TLC Level 0 ("TL0") to a QLC Level 1 ("QL1") programming state is a significantly higher change in threshold voltage distribution than any of the TLC Level 1-7 ("TL1-TL7") programming states to the QLC Level 2-15 ("QL2-QL15") programming states. To illustrate the flow of 2 programming passes for a 4 bit flash memory cells, the diagram 200 includes graph 202 that illustrates threshold voltage distributions of memory cells in an erased state, a graph 204 that illustrates threshold voltage distributions of memory cells that have received a first programming pass to be programmed to TLC programming states/levels, and a graph 206 that illustrates threshold voltage distributions of memory cells that have received a second programming pass to be programmed to QLC programming states/levels, according to one embodiment.

The graph 202 includes an x-axis that represents threshold voltages of memory cells, and includes a y-axis that represents a quantity of memory cells that have a particular threshold voltage. The graph 202 includes a memory cell distribution 208 that represents memory cells that have been erased, and are in a pre-programmed state. The memory cell distribution 208 shows that memory cells that have been erased have a distribution of threshold voltages, even though all of the memory cells are in an erased state, according to one embodiment. The memory cell distribution 208 is represented as a Level 0 ("L0") programming state.

The graph 204 illustrates threshold voltage distributions of memory cells that have received a first programming pass from an erased state to 8 TLC programming states/levels (e.g., 000 through 111), according to one embodiment. The TLC memory cell distributions 210 are represented as TLC Level 0 ("TL0"), TLC Level 1 ("TL1"), TLC Level 2 ("TL2"), TLC Level 3 ("TL3"), TLC Level 4 ("TL4"), TLC Level 5 ("TL5"), TLC Level 6 ("TL6"), and TLC Level 7 ("TL7"), according to one embodiment. All of the memory cell distributions 210 are programmed from the memory cell distribution 208 (i.e., from an erased state). As shown, the memory cell distributions for the erased state, Level 0, span a wider threshold voltage distribution than the programmed memory cell distributions for TLC programmed states TLC Level 1-7. The erased state, Level 0, has been pushed to a deeper, more negative, threshold voltage, to provide wider margins between the memory cell distributions for the QLC programmed states, discussed below.

The graph 206 illustrates threshold voltage distributions of memory cells that have received a second programming pass from one of 8 TLC programming states/levels to one of 16 QLC programming states/levels (e.g., 0000 through 1111), according to one embodiment. The QLC memory cell distributions 212 are represented as QLC Level 0 ("QL0"), QLC Level 1 ("QL1"), QLC Level 2 ("QL2"), QLC Level 3 ("QL3"), QLC Level 4 ("QL4"), QLC Level 5 ("QL5"), QLC Level 6 ("QL6"), QLC Level 7 ("QL7"), QLC Level 8 ("QL8"), QLC Level 9 ("QL9"), QLC Level 10 ("QL10"), QLC Level 11 ("QL11"), QLC Level 12 ("QL12"), QLC Level 13 ("QL13"), QLC Level 14 ("QL14"), and QLC Level 15 ("QL15"), according to one embodiment. All of the memory cell distributions 212 are programmed from the memory cell distributions 210, in a second programming pass. As shown, QLC Level 0 and QLC Level 1 are programmed from TLC Level 0, QLC Level 2 and QLC Level 3 are programmed from TLC Level 1, QLC Level 4 and QLC Level 5 are programmed from TLC Level 2, QLC Level 6 and QLC Level 7 are programmed from TLC Level 3, QLC Level 8 and QLC Level 9 are programmed from TLC Level 4, QLC Level 10 and QLC Level 11 are programmed from TLC Level 5, QLC Level 12 and QLC Level 13 are programmed from TLC Level 6, and QLC Level 14 and QLC Level 15 are programmed from TLC Level 7, according to one embodiment.

The change in threshold voltage distributions from TLC Level 0 to QLC Level 1 is distribution delta 214 ("ΔVth1"). The change in threshold voltage distributions from TLC Level 3 to QLC Level 7 is distribution delta 216 ("ΔVth2"). The distribution delta 216 ΔVth2 is representative of any of the TLC to QLC programming state transitions (with the exception of TLC Level 0 to QLC Level 1). Notably, the distribution delta 214 ΔVth1 is significantly larger than any of the other TLC to QLC distribution delta(s) 216 ΔVth2. One reason the distribution delta 214 ΔVth1 is significantly larger than any of the other TLC to QLC distribution delta(s) 216 ΔVth2 is because the memory cell threshold voltage distribution of TLC Level 0 is wider than any of the TLC Levels 1-7, according to one embodiment. As a result, an aggressor memory cell (i.e., adjacent to a target memory cell and programmed after the target memory cell) that is programmed to transition from TLC Level 0 to QLC Level 1 will have much greater fg-fg interference effect on a target cell than any of the other TLC Level to QLC Level programming state transitions. As a result, as disclosed here, the fg-fg interference compensation logic 142 (of FIG. 1) or other ECC logic 134 is configured to determine if an aggressor memory cell is Level 1 (i.e., QLC Level 1) to determine whether or not a target memory cell is disturbed or undisturbed, according to one embodiment.

Figure 3:
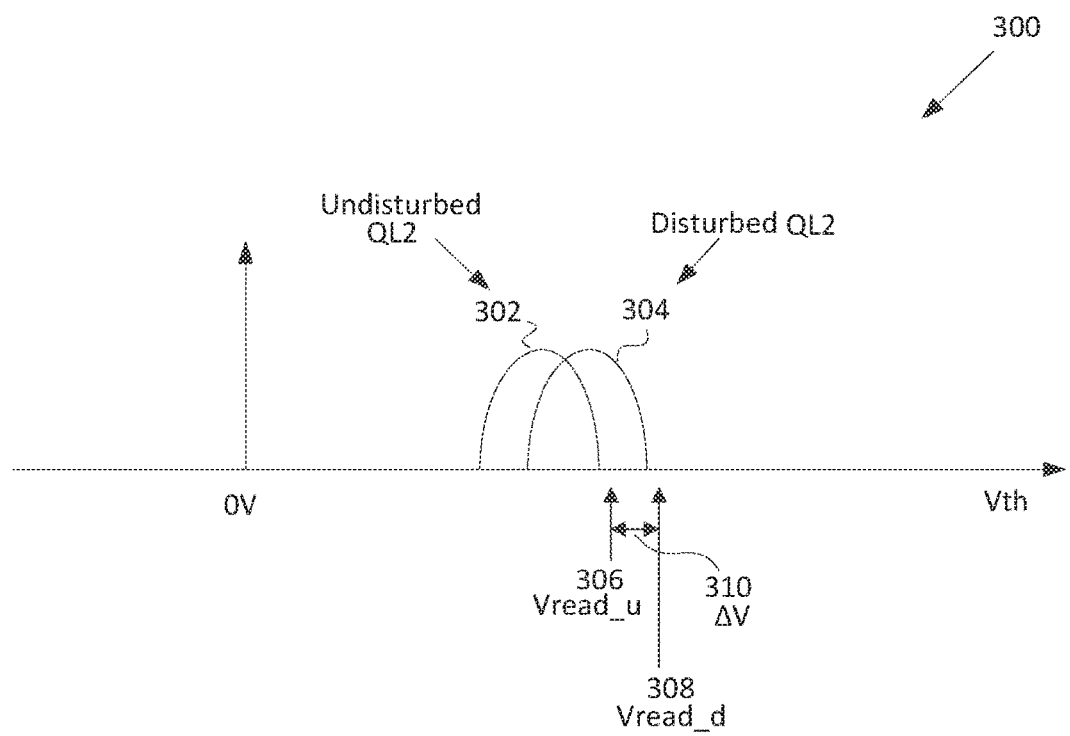
FIG. 3 is an illustrative graph for adjusting sensing parameters to compensate for fg-fg interference in flash memory cell read operations, in accordance with at least one embodiment described herein.

FIG. 3 illustrates a graph 300 that shows that undisturbed memory cells have a different or lower threshold voltage distribution than the threshold voltage distribution of disturbed memory cells. In other words, when a memory cell is disturbed, the threshold voltage of the disturbed memory cell is increased. Accordingly, disturbed memory cells have a first threshold voltage and undisturbed memory cells have a second (lower) threshold voltage. As a result, the undisturbed memory cells are read or sensed at a lower threshold voltage using a different word line read voltage (or other sensing technique) than is used to read or sense the disturbed memory cells that need to be sensed at a higher threshold voltage, according to one embodiment. The graph 300 includes an undisturbed memory cell distribution 302 and a disturbed memory cell distribution 304, according to one embodiment. The undisturbed memory cell distribution 302 has a maximum threshold voltage that is lower than a maximum threshold voltage of the disturbed memory cell distribution 304, according to one embodiment. The undisturbed memory cell distribution 302 is a distribution of memory cells programmed to QLC Level 2, and the disturbed memory cell distribution 304 is a distribution of memory cells programmed to QLC Level 2, according to one embodiment. However, the undisturbed and disturbed distributions of memory cells and programmed QLC Level 2 are merely representative of distributions that are applicable to any one of the memory cell distributions for QLC Levels 0-15, according to one embodiment.

The graph 300 illustrates an undisturbed memory cell read voltage level 306 ("Vread_u") and a disturbed memory cell read voltage level 308 ("Vread_d"), according to one embodiment. The undisturbed memory cell read voltage level 306 may be set to be marginally higher than the maximum threshold voltage for the undisturbed memory cell distribution 302, according to one embodiment. The disturbed memory cell read voltage level 308 may be set to the marginally higher than the maximum threshold voltage for the disturbed memory cell distribution 304, according to one embodiment. The difference between the disturbed memory cell read voltage level 308 and the undisturbed memory cell read voltage level 306 is a distribution delta 310 ("V"), according to one embodiment. The distribution delta 310 may be a predetermined/fixed voltage delta that is applied to a wordline read voltage level to enable word line control logic to compensate for disturbed memory cells, according to one embodiment. The distribution delta 310 may be a different voltage level for different programming states, according to one embodiment. For example, QLC Levels 2-5 may receive a first voltage delta (e.g., 0.1 V) while QLC Levels 5-15 may receive a second voltage delta (e.g., 0.15 V), according to one embodiment. Other parameters that may be adjusted to compensate for the higher threshold voltage of the disturbed memory cells includes, but is not limited to, adjusting bitline voltages, adjusting sense currents, and adjusting sense voltage strobe times, according to various embodiments.

Figure 4:
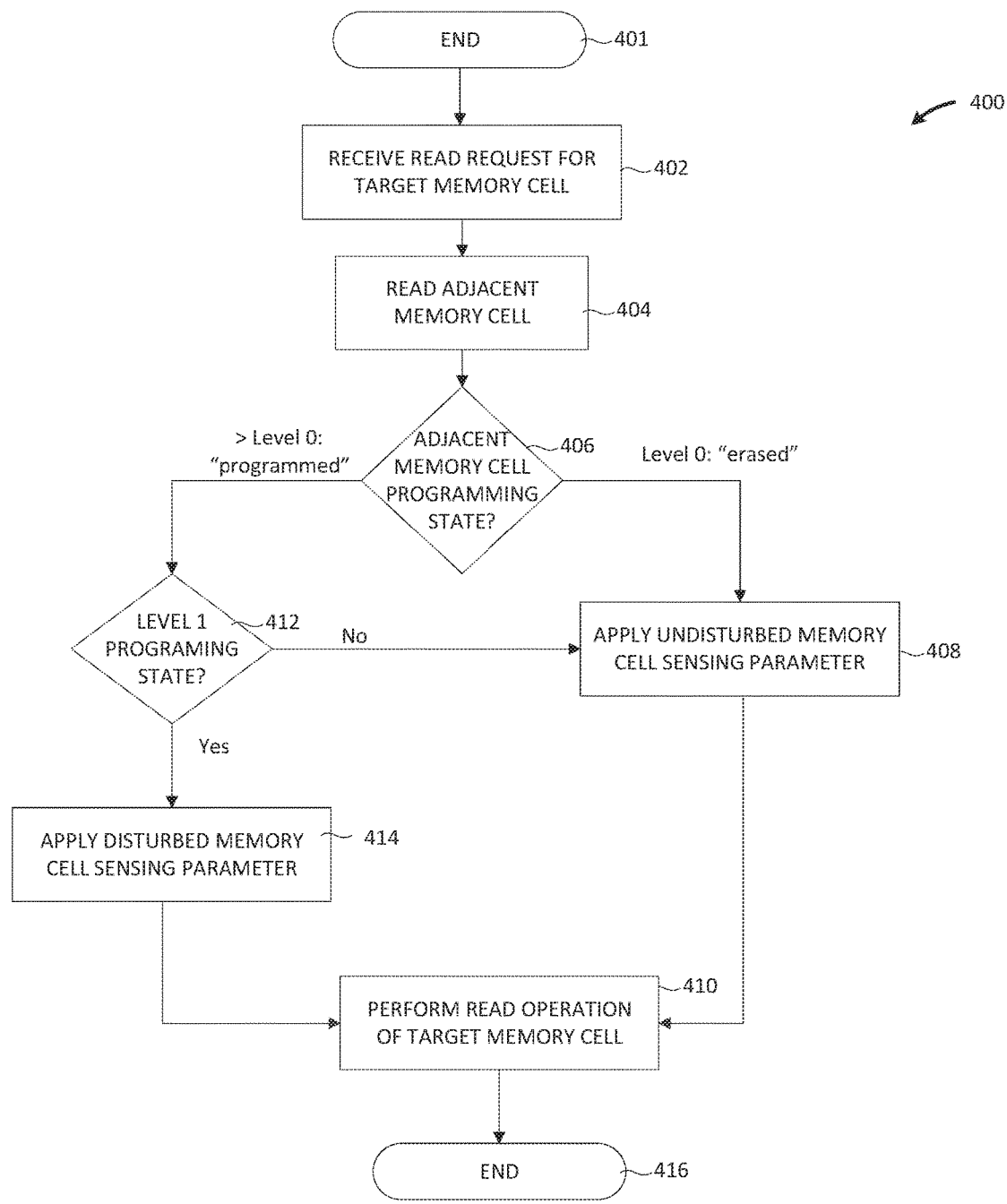
FIG. 4 is a high-level logic flow diagram of an illustrative method of compensating for fg-fg interference in flash memory cell read operations, in accordance with at least one embodiment described herein.

FIG. 4 is a high-level logic flow diagram of an illustrative method 400 for compensating for fg-fg interference in flash memory cell read operations, in accordance with at least one embodiment described herein. The method 400 commences at operation 401. Operation 401 may proceed to operation 402.

At operation 402, the method 400 includes receiving a request for a target memory cell, according to one embodiment. Operation 402 may proceed to operation 404.

At operation 404, the method 400 includes reading and adjacent memory cell, according to one embodiment. The adjacent memory cell is adjacent to the target memory cell on a flash memory cell string, according to one embodiment. In other words, a drain of the adjacent memory cell is connected the source of the target memory cell, or the source of the adjacent memory cell is connected to the drain of the target memory cell, according to one embodiment. The adjacent memory cell refers to an adjacent memory cell that is programmed after the target memory cell. Being programmed after the target memory cell, causes the adjacent (aggressor) memory cell to influence/disturb the threshold voltage of the target memory cell. Operation 404 may proceed to operation 406.

At operation 406, the method 400 includes determining the programming state of the adjacent memory cell, according to one embodiment. Determining the programming state of the adjacent memory cell, as described herein, does not include determining the programming state of the adjacent memory cell if the programming state is greater than L1, according to one embodiment. That is, the method 400 determines whether the programming state of the adjacent memory cell is in the erased state (i.e., Level 0), is in programming state Level 1, or is simply some other programming state (e.g., L2-L15 for QLC), according to one embodiment. If the programming state of the adjacent memory cell is Level 0 (i.e., erased), operation 406 proceeds to operation 408, according to one embodiment. If the programming state of the adjacent memory cell is greater than Level 0, operation 406 proceeds to operation 412, according to one embodiment. The method 400 may determine whether the programming state of the adjacent memory cell is Level 0 or is greater than Level 0 by applying a threshold voltage Vth to the wordline of the adjacent memory cell that is greater than the threshold voltages for the memory cells in the erased state and sensing the discharge of a pre-charged voltage level of the bitline that is coupled to the adjacent memory cell, according to one embodiment.

At operation 408, the method 400 includes applying an undisturbed memory cell sensing parameter to the read operation for the target memory cell, according to one embodiment. An undisturbed memory cell sensing parameter is the memory cell sensing parameter typically used for reading a memory cell that is not identified as being disturbed, according to one embodiment. Operation 408 proceeds to operation 410, according to one embodiment.

At operation 410, the method 400 includes performing the read operation of the target memory cell using the cell sensing parameters set by operation 408 or operation 414, according to one embodiment. Operation 410 may proceed to operation 416 where the method 400 concludes.

At operation 412, the method 400 includes determining if the adjacent memory cell has a programming state of Level 1, according to one embodiment. If the adjacent memory cell is not programmed to programming state Level 1, operation 412 may proceed to operation 408. If the adjacent memory cell is programmed to programming state Level 1, operation 412 may proceed to operation 414, according to one embodiment.

At operation 414, the method 400 includes applying a disturbed memory cell sensing parameter to the read operation for the target memory cell, according to one embodiment. Applying a disturbed memory cell sensing parameter includes increasing a wordline read voltage level by a predetermined voltage to compensate for an increased threshold voltage in the disturbed memory cells (as compared to the undisturbed memory cells), according to one embodiment. A disturbed memory cell sensing parameter may include, but is not limited to, decreasing a pre-charged bitline voltage level, and increasing a sensing circuitry strobe time. Operation 414 may proceed to operation 410, according to one embodiment.

The method 400 concludes at operation 416, according to one embodiment.

Figure 5:
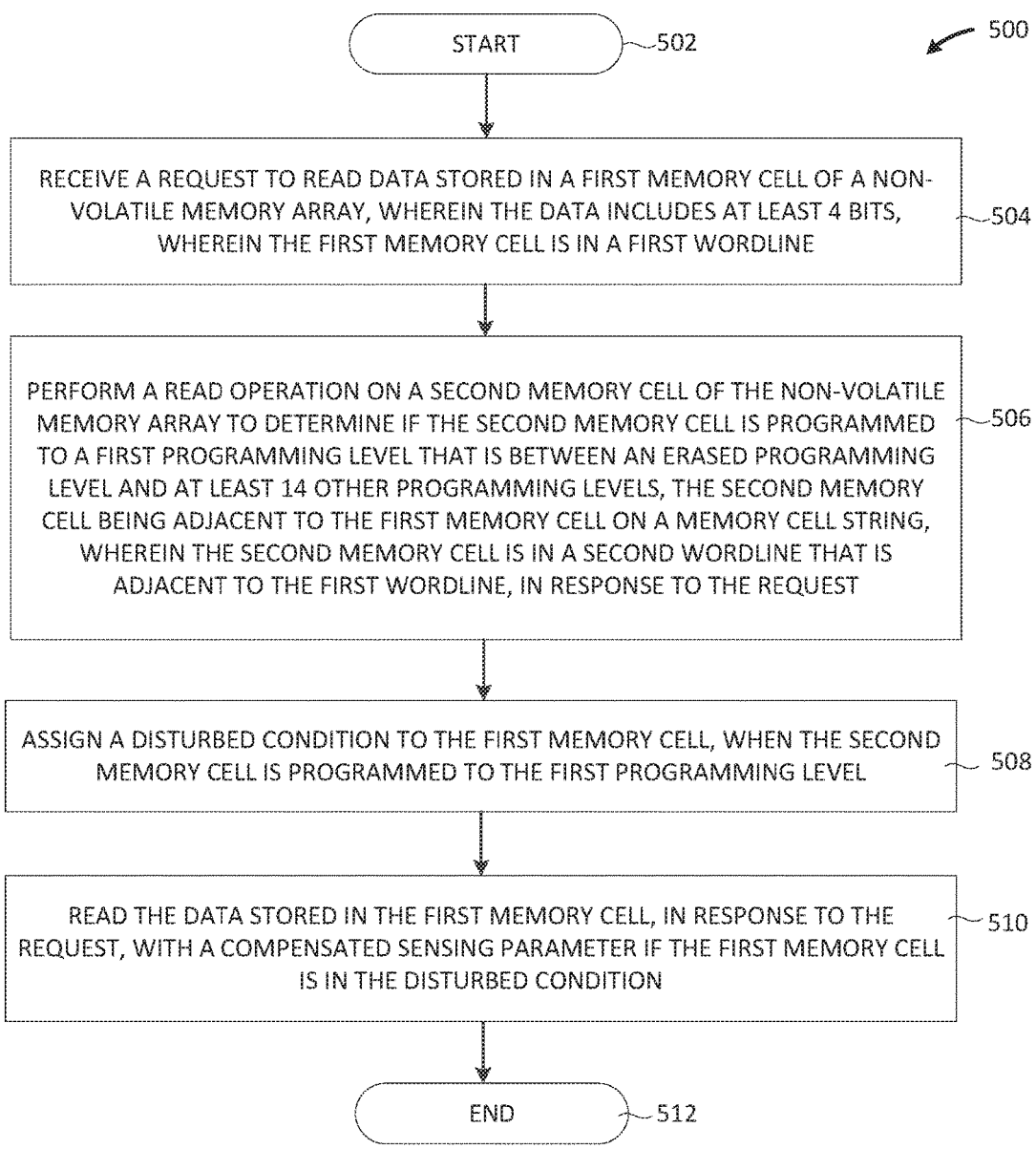
FIG. 5 is a high-level logic flow diagram of an illustrative method of compensating for fg-fg interference in flash memory cell read operations, in accordance with at least one embodiment described herein.

FIG. 5 is a high-level logic flow diagram of an illustrative method 500 for compensating for fg-fg interference in flash memory cell read operations, in accordance with at least one embodiment described herein. The method 500 commences at operation 502, according to one embodiment. Operation 502 may proceed to operation 504, according to one embodiment.

At operation 504, the method 500 includes receiving a request to read data stored in a first memory cell of a non-volatile memory array, wherein the data includes at least 4 bits, wherein the first memory cell is operated with a first wordline, according to one embodiment. Operation 504 may proceed to operation 506.

At operation 506, the method 500 includes performing a read operation on a second memory cell of the non-volatile memory array to determine if the second memory cell is programmed to a first programming level that is between an erased programming level and at least 14 other programming levels, the second memory cell being adjacent to the first memory cell on a memory cell string, wherein the second memory cell is operated with a second wordline that is adjacent to the first wordline, in response to the request, according to one embodiment. Operation 506 may proceed to operation 508.

At operation 508, the method 500 includes assigning a disturbed condition to the first memory cell, when the second memory cell is programmed to the first programming level, according to one embodiment. Operation 508 may proceed to operation 510.

At operation 510, the method 500 includes reading the data stored in the first memory cell, in response to the request, with a compensated sensing parameter if the first memory cell is in the disturbed condition, according to one embodiment. Operation 510 may proceed to operation 512.

At operation 512, the method 500 concludes, according to one embodiment.

Operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment", "an embodiment", or "an implementation" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in any embodiment herein, the term "logic" may refer to an application, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hardwired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, within the memory controller 112 that executes code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip ("SoC") architecture.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories ("CD-ROMs"), compact disk rewritables ("CD-RWs"), and magneto-optical disks, semiconductor devices such as read-only memories ("ROMs"), random access memories ("RAMs") such as dynamic and static RAMs, erasable programmable read-only memories ("EPROMs"), electrically erasable programmable read-only memories ("EEPROMs"), flash memories, magnetic or optical cards, or any type of storage devices suitable for storing electronic instructions.

In some embodiments, a hardware description language ("HDL") may be used to specify circuit and/or logic implementation(s) for the various logic and/or circuitry described herein. For example, in one embodiment the hardware description language may comply or be compatible with a very high speed integrated circuits ("VHSIC") hardware description language ("VHDL") that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a memory controller, a method, and a system related to reducing program disturb degradation in a memory array, as discussed below.

Example 1

According to this example there is provided a memory controller. The memory controller may include memory controller logic to: receive a request to read data stored in a first memory cell of a multi-level non-volatile memory array, wherein the data includes at least 4 bits, wherein the first memory cell is in a first wordline; perform a read operation on a second memory cell of the flash memory array to determine if the second memory cell is programmed to a first programming level that is between an erased programming level and at least 14 other programming levels, the second memory cell being adjacent to the first memory cell on a memory cell string, wherein the second memory cell is operated with a second wordline that is adjacent to the first wordline, in response to the request; and read the data stored in the first memory cell, in response to the request, with a compensated sensing parameter if the first memory cell is in a disturbed condition. The memory controller may include error-correcting code logic to determine that the first memory cell is in the disturbed condition when the second memory cell is programmed to the first QLC programming level.

Example 2

This example includes the elements of example 1, wherein the first memory cell is read at a first threshold voltage in the disturbed condition and is read at a second threshold voltage in an undisturbed condition, wherein the first threshold voltage is higher than the second threshold voltage.

Example 3

This example includes the elements of example 1, wherein the first memory cell and the second memory cell are two of a plurality of memory cells, wherein a threshold voltage distribution of an erased TLC programming level of the plurality of memory cells is at least 2-3 times wider than threshold voltage distributions of each of the 14 other programming levels.

Example 4

This example includes the elements of example 1, wherein the first programming level is adjacent to the erased programming level, wherein the first programming level is a QLC Level 1 programming level, wherein the erased programming level is a QLC Level 0 programming level.

Example 5

This example includes the elements of example 1, wherein the second memory cell is programmed to one of 8 TLC programming levels prior to the first memory cell being programmed to one of 16 QLC programming levels, wherein the first memory cell is programmed to one of the 16 QLC programming levels prior to the second memory cell being programmed to one of the 16 QLC programming levels.

Example 6

This example includes the elements of example 1, wherein the first memory cell and the second memory cell are two of a plurality of memory cells, wherein the plurality of memory cells are programmed to one of 8 TLC programming levels in a first programming pass, prior to being programmed to one of 16 QLC programming levels in a second programming pass.

Example 7

This example includes the elements of example 1, wherein the compensated sensing parameter includes an increased wordline read voltage level, an adjusted sense current, or an adjusted bitline voltage level, to compensate for an increased threshold voltage from the disturbed condition of the first memory cell.

Example 8

According to this example there is provided a system. The system may include a display; memory array having a plurality of memory cells; and a memory controller may include memory controller logic to: receive a request to read data stored in a first memory cell of a multi-level non-volatile memory array, wherein the data includes at least 4 bits, wherein the first memory cell is in a first wordline; perform a read operation on a second memory cell of the flash memory array to determine if the second memory cell is programmed to a first programming level that is between an erased programming level and at least 14 other programming levels, the second memory cell being adjacent to the first memory cell on a memory cell string, wherein the second memory cell is operated with a second wordline that is adjacent to the first wordline, in response to the request; and read the data stored in the first memory cell, in response to the request, with a compensated sensing parameter if the first memory cell is in a disturbed condition. The memory controller may include error-correcting code logic to determine that the first memory cell is in the disturbed condition when the second memory cell is programmed to the first QLC programming level.

Example 9

This example includes the elements of example 8, wherein the first memory cell is read at a first threshold voltage in the disturbed condition and is read at a second threshold voltage in an undisturbed condition, wherein the first threshold voltage is higher than the second threshold voltage.

Example 10

This example includes the elements of example 8, wherein the first memory cell and the second memory cell are two of a plurality of memory cells, wherein a threshold voltage distribution of an erased TLC programming level of the plurality of memory cells is at least 2-3 times wider than threshold voltage distributions of the 14 other programming levels.

Example 11

This example includes the elements of example 8, wherein the first programming level is adjacent to the erased programming level, wherein the first programming level is a QLC Level 1 programming level, wherein the erased programming level is a QLC Level 0 programming level.

Example 12

This example includes the elements of example 8, wherein the second memory cell is programmed to one of 8 TLC programming levels prior to the first memory cell being programmed to one of 16 QLC programming levels, wherein the first memory cell is programmed to one of 16 QLC programming levels prior to the second memory cell being programmed to one of 16 QLC programming levels.

Example 13

This example includes the elements of example 8, wherein the first memory cell and the second memory cell are two of a plurality of memory cells, wherein the plurality of memory cells are programmed to one of 8 TLC programming levels in a first programming pass, prior to being programmed to one of 16 QLC programming levels in a second programming pass.

Example 14

This example includes the elements of example 8, wherein the compensated sensing parameter includes an increased wordline read voltage level, an adjusted sense current, or an adjusted bitline voltage level, to compensate for an increased threshold voltage from the disturbed condition of the first memory cell.

Example 15

According to this example there is provided a computer readable storage device having stored thereon instructions that when executed by one or more processors result in operations. The operations may include receive a request to read data stored in a first memory cell of a flash memory array, wherein the data includes at least 4 bits, wherein the first memory cell is operated with a first wordline; perform a read operation on a second memory cell of the flash memory array to determine if the second memory cell is programmed to a first programming level that is between an erased programming level and at least 14 other programming levels, the second memory cell being adjacent to the first memory cell on a memory cell string, wherein the second memory cell is operated with a second wordline that is adjacent to the first wordline, in response to the request; assign a disturbed condition to the first memory cell, when the second memory cell is programmed to the first programming level; and read the data stored in the first memory cell, in response to the request, with a compensated sensing parameter if the first memory cell is in the disturbed condition.

Example 16

This example includes the elements of example 15, wherein the first memory cell is read at a first threshold voltage in the disturbed condition and is read at a second threshold voltage in an undisturbed condition, wherein the first threshold voltage is higher than the second threshold voltage.

Example 17

This example includes the elements of example 15, wherein the first programming level is adjacent to the erased programming level, and the first programming level is a QLC Level 1 programming level, while the erased programming level is a QLC Level 0 programming level.

Example 18

This example includes the elements of example 15, wherein the first memory cell and the second memory cell are two of a plurality of memory cells, wherein the plurality of memory cells is programmed to one of 8 TLC programming levels in a first programming pass, prior to being programmed to one of 16 QLC programming levels in a second programming pass.

Example 19

This example includes the elements of example 15, wherein the compensated sensing parameter includes an increased wordline read voltage level, an adjusted sense current, or an adjusted bitline voltage level, to compensate for an increased threshold voltage from the disturbed condition of the first memory cell.

Example 20

This example includes the elements of example 15, wherein the first memory cell and the second memory cell are two of a plurality of memory cells, wherein a threshold voltage distribution of an erased TLC programming level of the plurality of memory cells is at least 2-3 times wider than threshold voltage distributions of 15 QLC programming levels.

Example 21

This example includes the elements of example 15, wherein the second memory cell is programmed to one of 8 TLC programming levels prior to the first memory cell being programmed to one of 16 QLC programming levels, wherein the first memory cell is programmed to one of the 16 QLC programming levels prior to the second memory cell being programmed to one of the 16 QLC programming levels.

Example 22

According to this example there is provided a method. The method may include receiving a request to read data stored in a first memory cell of a non-volatile memory array, wherein the data includes at least 4 bits, wherein the first memory cell is in a first wordline; performing a read operation on a second memory cell of the flash memory array to determine if the second memory cell is programmed to a first programming level that is between an erased programming level and at least 14 other programming levels, the second memory cell being adjacent to the first memory cell on a memory cell string, wherein the second memory cell is in a second wordline that is adjacent to the first wordline, in response to the request; assigning a disturbed condition to the first memory cell, when the second memory cell is programmed to the first programming level; and reading the data stored in the first memory cell, in response to the request, with a compensated sensing parameter if the first memory cell is in the disturbed condition.

Example 23

This example includes the elements of example 22, wherein the first memory cell is read at a first threshold voltage in the disturbed condition and is read at a second threshold voltage in an undisturbed condition, wherein the first threshold voltage is higher than the second threshold voltage.

Example 24

This example includes the elements of example 22, wherein the first programming level is adjacent to the erased programming level, and the first programming level is a QLC Level 1 programming level, while the erased programming level is a QLC Level 0 programming level.

Example 25

This example includes the elements of example 22, wherein the first memory cell and the second memory cell are two of a plurality of memory cells, wherein the plurality of memory cells is programmed to one of 8 TLC programming levels in a first programming pass, prior to being programmed to one of 16 QLC programming levels in a second programming pass.

Example 26

This example includes the elements of example 22, wherein the compensated sensing parameter includes an increased wordline read voltage level, an adjusted sense current, or an adjusted bitline voltage level, to compensate for an increased threshold voltage from the disturbed condition of the first memory cell.

Example 27

This example includes the elements of example 22, wherein the first memory cell and the second memory cell are two of a plurality of memory cells, wherein a threshold voltage distribution of an erased TLC programming level of the plurality of memory cells is at least 2-3 times wider than threshold voltage distributions of 15 QLC programming levels.

Example 28

This example includes the elements of example 22, wherein the second memory cell is programmed to one of 8 TLC programming levels prior to the first memory cell being programmed to one of 16 QLC programming levels, wherein the first memory cell is programmed to one of the 16 QLC programming levels prior to the second memory cell being programmed to one of the 16 QLC programming levels.

Example 29

According to this example there is provided a memory controller. The memory controller may include means for receiving a request to read data stored in a first memory cell of a flash memory array, wherein the data includes at least 4 bits, wherein the first memory cell is operated with a first wordline; means for performing a read operation on a second memory cell of the flash memory array to determine if the second memory cell is programmed to a first QLC programming level that is between an erased QLC programming level and at least 14 other QLC programming levels, the second memory cell being adjacent to the first memory cell on a NAND memory cell string, wherein the second memory cell is operated with a second wordline that is adjacent to the first wordline, in response to the request; means for assigning a disturbed condition to the first memory cell, when the second memory cell is programmed to the first QLC programming level; and means for reading the data stored in the first memory cell, in response to the request, with a compensated sensing parameter if the first memory cell is in the disturbed condition.

Example 30

This example includes the elements of example 29, wherein the first memory cell is read at a first threshold voltage in the disturbed condition and is read at a second threshold voltage in an undisturbed condition, wherein the first threshold voltage is higher than the second threshold voltage.

Example 31

This example includes the elements of example 29, wherein the first QLC programming level is adjacent to the erased QLC programming level, and the first QLC programming level is a QLC Level 1 programming level, while the erased QLC programming level is a QLC Level 0 programming level.

Example 32

This example includes the elements of example 29, wherein the first memory cell and the second memory cell are two of a plurality of memory cells, wherein the plurality of memory cells are programmed to one of 8 TLC programming levels in a first programming pass, prior to being programmed to one of 16 QLC programming levels in a second programming pass.

Example 33

This example includes the elements of example 29, wherein the compensated sensing parameter includes an increased wordline read voltage level, an adjusted sense current, or an adjusted bitline voltage level, to compensate for an increased threshold voltage from the disturbed condition of the first memory cell.

Example 34

This example includes the elements of example 29, wherein the first memory cell and the second memory cell are two of a plurality of memory cells, wherein a threshold voltage distribution of an erased TLC programming level of the plurality of memory cells is at least 2-3 times wider than threshold voltage distributions of 15 QLC programming levels.

Example 35

This example includes the elements of example 29, wherein the second memory cell is programmed to one of 8 TLC programming levels prior to the first memory cell being programmed to one of 16 QLC programming levels, wherein the first memory cell is programmed to one of the 16 QLC programming levels prior to the second memory cell being programmed to one of the 16 QLC programming levels.

Example 36

According to this example there is provided a system of any one of examples 8 to 14, further including processor circuitry.

Example 37

According to this example there is provided a device comprising means to perform the method of any one of examples 22 to 28.

Example 38

According to this example there is provided computer readable storage device having stored thereon instructions that when executed by one or more processors result in operations comprising: the method according to any one of examples 22 to 28.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A memory controller, comprising:
    memory controller logic to:
        receive a request to read data stored in a first memory cell of a multi-level non-volatile memory array, wherein the data includes at least 4 bits, wherein the first memory cell is in a first wordline;
        perform a read operation on a second memory cell of the multi-level non-volatile memory array to determine if the second memory cell is programmed to a first programming level that is between an erased programming level and at least 14 other programming levels, the second memory cell being adjacent to the first memory cell on a memory cell string, wherein the second memory cell is operated with a second wordline that is adjacent to the first wordline, in response to the request;
        assign a disturbed condition to the first memory cell responsive to a determination that the second memory cell is at the first programming level; and
        read the data stored in the first memory cell, in response to the request, with a compensated sensing parameter responsive to the assignment of the disturbed condition to the first memory cell; and
    error-correcting code logic to determine that the first memory cell is in the disturbed condition when the second memory cell is programmed to the first programming level.

2. The memory controller of claim 1, wherein the first memory cell is read at a first threshold voltage in the disturbed condition and is read at a second threshold voltage in an undisturbed condition, wherein the first threshold voltage is higher than the second threshold voltage.

3. The memory controller of claim 1, wherein the first memory cell and the second memory cell are two of a plurality of memory cells, wherein a threshold voltage distribution of an erased TLC programming level of the plurality of memory cells is at least 2-3 times wider than threshold voltage distributions of each of the 14 other programming levels.

4. The memory controller of claim 1, wherein the first programming level is adjacent to the erased programming level, wherein the first programming level is a QLC Level 1 programming level, wherein the erased programming level is a QLC Level 0 programming level.

5. The memory controller of claim 1, wherein the second memory cell is programmed to one of 8 TLC programming levels prior to the first memory cell being programmed to one of 16 QLC programming levels, wherein the first memory cell is programmed to one of 16 QLC programming levels prior to the second memory cell being programmed to one of 16 QLC programming levels.

6. The memory controller of claim 1, wherein the first memory cell and the second memory cell are two of a plurality of memory cells, wherein the plurality of memory cells is programmed to one of 8 TLC programming levels in a first programming pass, prior to being programmed to one of 16 QLC programming levels in a second programming pass.

7. The memory controller of claim 1, wherein the compensated sensing parameter includes an increased wordline read voltage level, an adjusted sense current, or an adjusted bitline voltage level, to compensate for an increased threshold voltage from the disturbed condition of the first memory cell.

8. A system, comprising:
    a display;
    a memory array having a plurality of memory cells; and
    a memory controller, comprising:
        memory controller logic to:
            receive a request to read data stored in a first memory cell of a non-volatile memory array, wherein the data includes at least 4 bits, wherein the first memory cell is in a first wordline;
            perform a read operation on a second memory cell of the non-volatile memory array to determine if the second memory cell is programmed to a first programming level that is between an erased programming level and at least 14 other programming levels, the second memory cell being adjacent to the first memory cell on a memory cell string, wherein the second memory cell is operated with a second wordline that is adjacent to the first wordline, in response to the request;
            assign a disturbed condition to the first memory cell responsive to a determination that the second memory cell is at the first programming level; and
            read the data stored in the first memory cell, in response to the request, with a compensated sensing parameter responsive to the association of the first memory cell with the disturbed condition; and
        error-correcting code logic to determine that the first memory cell is in the disturbed condition when the second memory cell is programmed to the first programming level.

9. The system of claim 8, wherein the first memory cell is read at a first threshold voltage in the disturbed condition and is read at a second threshold voltage in an undisturbed condition, wherein the first threshold voltage is higher than the second threshold voltage.

10. The system of claim 8, wherein the first memory cell and the second memory cell are two of a plurality of memory cells, wherein a threshold voltage distribution of an erased TLC programming level of the plurality of memory cells is at least 2-3 times wider than threshold voltage distributions of the 14 other programming levels.

11. The system of claim 8, wherein the first programming level is adjacent to the erased programming level, wherein the first programming level is a QLC Level 1 programming level, wherein the erased programming level is a QLC Level 0 programming level.

12. The system of claim 8, wherein the second memory cell is programmed to one of 8 TLC programming levels prior to the first memory cell being programmed to one of 16 QLC programming levels, wherein the first memory cell is programmed to one of 16 QLC programming levels prior to the second memory cell being programmed to one of 16 QLC programming levels.

13. The system of claim 8, wherein the first memory cell and the second memory cell are two of a plurality of memory cells, wherein the plurality of memory cells is programmed to one of 8 TLC programming levels in a first programming pass, prior to being programmed to one of 16 QLC programming levels in a second programming pass.

14. The system of claim 8, wherein the compensated sensing parameter includes an increased wordline read voltage level, an adjusted sense current, or an adjusted bitline voltage level, to compensate for an increased threshold voltage from the disturbed condition of the first memory cell.

15. A method, comprising:
    receiving a request to read data stored in a first memory cell of a non-volatile memory array, wherein the data includes at least 4 bits, wherein the first memory cell is in a first wordline;
    performing a read operation on a second memory cell of the non-volatile memory array, the second memory cell being adjacent to the first memory cell on a memory cell string, wherein the second memory cell is in a second wordline that is adjacent to the first wordline, in response to the request;
    determining whether the second memory cell is programmed to a first programming level that is between an erased programming level and at least 14 other programming levels;
    assigning a disturbed condition to the first memory cell, responsive to a determination that the second memory cell is at the first programming level; and
    reading the data stored in the first memory cell, in response to the request, with a compensated sensing parameter responsive to assignment of the disturbed condition to the first memory cell.

16. The method of claim 15, wherein the first memory cell is read at a first threshold voltage in the disturbed condition and is read at a second threshold voltage in an undisturbed condition, wherein the first threshold voltage is higher than the second threshold voltage.

17. The method of claim 15, wherein the first programming level is adjacent to the erased programming level, and the first programming level is a QLC Level 1 programming level, while the erased programming level is a QLC Level 0 programming level.

18. The method of claim 15, wherein the first memory cell and the second memory cell are two of a plurality of memory cells, wherein the plurality of memory cells is programmed to one of 8 TLC programming levels in a first programming pass, prior to being programmed to one of 16 QLC programming levels in a second programming pass.

19. The method of claim 15, wherein the compensated sensing parameter includes an increased wordline read voltage level, an adjusted sense current, or an adjusted bitline voltage level, to compensate for an increased threshold voltage from the disturbed condition of the first memory cell.

* * * * *